United States Patent
Hikita et al.

(10) Patent No.: US 6,717,244 B1
(45) Date of Patent: Apr. 6, 2004

(54) SEMICONDUCTOR DEVICE HAVING A PRIMARY CHIP WITH BUMPS IN JOINED REGISTRATION WITH BUMPS OF A PLURALITY OF SECONDARY CHIPS

(75) Inventors: Junichi Hikita, Kyoto (JP); Koji Yamamoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/511,108

(22) Filed: Feb. 23, 2000

(30) Foreign Application Priority Data

Feb. 23, 1999 (JP) .......................... 11-045210

(51) Int. Cl.$^7$ .............................................. H01L 23/02
(52) U.S. Cl. .................. 257/678; 257/666; 257/667; 257/777
(58) Field of Search ................ 257/777, 678, 257/666, 667, 668, 669, 686

(56) References Cited

U.S. PATENT DOCUMENTS

| | | | | |
|---|---|---|---|---|
| 4,145,708 A | * | 3/1979 | Ferro et al. | 257/715 |
| 4,979,289 A | * | 12/1990 | Dunaway et al. | 257/782 |
| 5,034,568 A | * | 7/1991 | Mather | 174/52.3 |
| 5,136,367 A | * | 8/1992 | Chiu | 257/668 |
| 5,872,700 A | * | 2/1999 | Collander | 174/260 |
| 5,977,640 A | * | 11/1999 | Bertin | 257/777 |
| 6,005,292 A | * | 12/1999 | Roldan | 257/777 |
| 6,048,777 A | * | 4/2000 | Choudhury et al. | 257/6 |
| 6,054,008 A | * | 4/2000 | Chan et al. | 156/247 |
| 6,077,725 A | * | 6/2000 | Degani | 438/108 |
| 6,118,184 A | * | 9/2000 | Ishio | 257/787 |
| 6,150,724 A | * | 11/2000 | Wenzel | 257/777 |
| 6,184,573 B1 | * | 2/2001 | Pu | 257/666 |
| 6,239,366 B1 | * | 5/2001 | Hsuan et al. | 174/52.3 |

FOREIGN PATENT DOCUMENTS

| | | | |
|---|---|---|---|
| JP | 405075016 A | * | 3/1993 |
| JP | 5-87949 U | | 11/1993 |
| JP | 8-17211 A1 | | 7/1996 |

* cited by examiner

Primary Examiner—Wael Fahmy
Assistant Examiner—Nathan W. Ha
(74) Attorney, Agent, or Firm—Rabin & Berdo, P.C.

(57) ABSTRACT

A semiconductor device having a plurality of semiconductor chips respectively joined to predetermined positions on a surface of a solid, and a frame holding the plurality of semiconductor chips in a relative positional relationship corresponding to joint positions on the surface of the solid. The solid may be another semiconductor chip or a wiring board. The plurality of semiconductor chips may be bonded to a surface, opposite to the surface of the solid, of the frame. The plurality of semiconductor chips may be respectively fitted in through holes formed in the frame.

6 Claims, 1 Drawing Sheet

SEMICONDUCTOR DEVICE HAVING A PRIMARY CHIP WITH BUMPS IN JOINED REGISTRATION WITH BUMPS OF A PLURALITY OF SECONDARY CHIPS

BACKGROUND OF THE INVENTION

1. Field of the Invention

The present invention relates generally to a semiconductor device, and more particularly, to a semiconductor device having a structure in which a plurality of semiconductor chips are bonded to a surface of a solid (for example, a semiconductor chip or a wiring board) and a method of assembling the same.

2. Description of Related Art

In order to increase a substantial integration degree of a semiconductor device, a semiconductor device having a chip-on-chip structure in which semiconductor chips in two layers are overlapped with each other has been paid attention to.

Specifically, a pad opening where internal wiring is partially exposed is provided on a device formation surface of each of semiconductor chips to be overlapped, for example. A projection electrode called a "bump" is provided in the pad opening. The semiconductor chips are overlapped with each other by so-called face-to-face bonding.

For example, one of the semiconductor chips is larger than the other semiconductor chip, and is taken as a mother chip or primary chip having an electrode for external connection. That is, an electrode is provided on a device formation surface of the primary chip, for example. The electrode is electrically connected to an electrode on an underlying substrate (a wiring board), and an external connecting electrode is provided on the underlying substrate. When the semiconductor device is mounted, the external connecting electrode on the underlying substrate is soldered to a printed board or a ceramic board.

There may, in some cases, be a plurality of semiconductor chips (daughter chip or secondary chips) to be overlapped with the primary chip. In this case, the secondary chips must be accurately aligned with and joined to the primary chip. The secondary chips are generally mounted on the primary chip one at a time. Accordingly, a mounting operation is repeatedly performed, and the number of times the operation is performed corresponds to the number of secondary chips. Therefore, a long time period is required for assembling. Since there are a plurality of secondary chips, the probability that the secondary chips are erroneously bonded or mounted (an erroneous mounting rate) is considerably high.

SUMMARY OF THE INVENTION

A first object of the present invention is to provide, in a semiconductor device having a structure in which a plurality of semiconductor chips are joined to a surface of a solid, a semiconductor device having a structure in which the production efficiency thereof can be improved.

A second object of the present invention is to provide, in a semiconductor device having a structure in which a plurality of semiconductor chips are joined to a surface of a solid, a semiconductor device having a structure in which the semiconductor chips can be prevented from being erroneously mounted.

A third object of the present invention is to provide a method of assembling a semiconductor device, in which a plurality of semiconductor chips can be efficiently joined to a surface of a solid and therefore, the productivity thereof can be improved.

A fourth object of the present invention is to provide a method of assembling a semiconductor device, in which a plurality of semiconductor chips can be accurately mounted on a surface of a solid, and the semiconductor chips can be prevented from being erroneously mounted.

A semiconductor device according to the present invention comprises a solid; a plurality of semiconductor chips respectively joined to predetermined positions of a surface of the solid; and a frame holding the plurality of semiconductor chips in a relative positional relationship corresponding to joint positions on the surface of the solid.

The solid may be another semiconductor chip or a wiring board.

The plurality of semiconductor chips may be bonded to a surface, opposite to the surface of the solid, of the frame.

The plurality of semiconductor chips may be respectively fitted in through holes formed in the frame.

The plurality of semiconductor chips and the frame may be together sealed with resin.

The frame may be also used as a lead frame. In this case, the solid and the frame may be electrically connected to each other by suitable means such as wire bonding.

According to the present invention, the plurality of semiconductor chips which are overlapped with and joined to the surface of the solid can be arranged in predetermined positions of the frame and can be overlapped with one another utilizing the frame. Consequently, the plurality of semiconductor chips can be overlapped with and joined to the surface of the solid by one mounting operation. If the plurality of semiconductor chips are arranged on the frame without error, erroneous mounting in the step of overlapping the frame with the surface of the solid is not a problem. Consequently, it is possible to realize a semiconductor device which is superior in production efficiency and in which semiconductor chips are hardly erroneously mounted.

A method of assembling a semiconductor device according to the present invention comprises the steps of holding a plurality of semiconductor chips in a frame in a relative positional relationship corresponding to joint positions on a surface of a solid; aligning and overlapping the frame with the surface of the solid; and joining the plurality of semiconductor chips held in the frame to the surface of the solid.

The frame may be removed from the plurality of semiconductor chips after the plurality of semiconductor chips are joined to the surface of the solid.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In embodiments of the present invention described below, it is presupposed that Si is used as the type of semiconductor. However, another semiconductor such as GaAs or Ge may be used.

Figure 1:
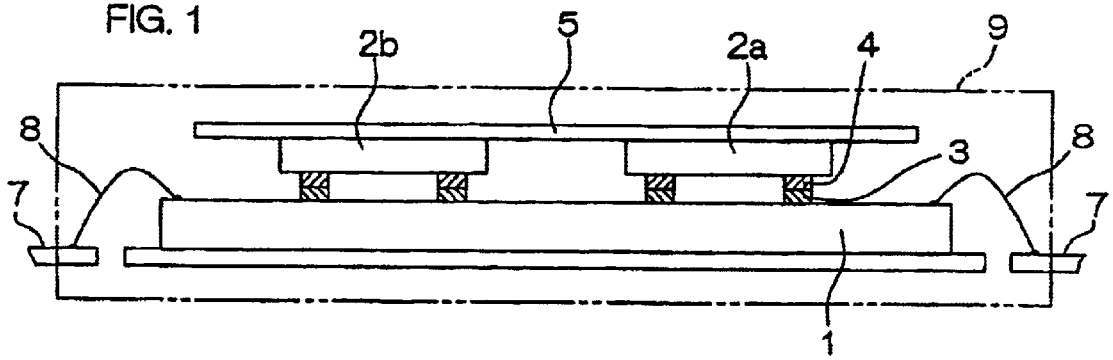
FIG. 1 is a side view showing are embodiment of the present invention, in which a plurality of secondary chips mounted on a frame are overlapped with a primary chip by so-called face-down bonding.

FIG. 1 is a side view showing a state where a plurality of secondary chips 2a and 2b are overlapped with a primary chip 1 by so-called face-down bonding. Bumps 3 are provided on a device formation surface of the primary chip 1, and bumps 4 are also provided in corresponding positions on device formation surfaces of the secondary chips 2a and 2b. The corresponding bumps 3 and 4 are joined to each other, thereby having assembled a semiconductor device having a so-called chip-on-chip structure.

The secondary chips 2a and 2b are in a state where they are mounted on one common frame 5. A material for the frame 5 is not particularly limited. Examples are a resin plate, a glass plate, a metal plate, a ceramic plate, and the like, which are transparent or opaque. Further, the thickness of the frame 5 is not particularly limited.

The frame 5 and the secondary chips 2a and 2b are bonded to each other with adhesives. The secondary chips 2a and 2b are mounted on the frame 5 in a relative positional relationship corresponding to joint positions on the primary chip 1. If the frame 5 and the primary chip 1 are aligned with each other, therefore, alignment between the plurality of secondary chips 2a and 2b and the primary chip 1 is collectively achieved.

A conventionally known method can be employed as a method of aligning the frame 5 and the primary chip 1. For example, a technique for aligning them by forming a through hole and seeing through the through hole a mark below the through hole (see Japanese Unexamined Patent Publication (KOKAI) No. 8-172111) may be applied. That is, they can be aligned by forming a through hole in the frame 5 and detecting a mark provided on the primary chip 1 through the through hole. Alternatively, a mark may be formed at an end of an upper surface of the frame 5 (an upper surface in FIG. 1), also forming a mark on an upper surface of the primary chip 1, and confirming a positional relationship between both the marks as viewed from above (see Japanese Unexamined Utility Model Publication (KOKAI) No. 5-87949). Further, if the frame 5 is transparent, they can be aligned by forming marks on a central region (a position avoiding the secondary chips 2a and 2b) of the frame 5 and an upper surface of the primary chip 1 and confirming a positional relationship between both the marks as viewed from above.

The frame 5 on which the secondary chips 2a and 2b are mounted is thus overlapped with the primary chip 1, thereby making it possible to align and join all the secondary chips 2a and 2b with and to the primary chip 1 in one step.

Thereafter, the primary chip 1 is wired, via bonding wires 8, to a lead frame 7 for external connection, and the primary chip 1 and the secondary chips 2a and 2b, together with the frame 5, are molded with a sealing resin 9, whereby the semiconductor device having a chip-on-chip structure is completed.

An erroneous mounting rate will be discussed. If the secondary chips 2a and 2b are correctly mounted on the frame 5, the secondary chips 2a and 2b may not be thereafter erroneously mounted on the primary chip 1 in the step of overlapping the frame 5 with the primary chip 1. Consequently, the erroneous mounting is a problem in the step of mounting the secondary chips 2a and 2b on the frame 5. For example, if the appearance of the frame 5 on which the secondary chips 2a and 2b are mounted can be examined, it is possible to improve the fabrication yield of the semiconductor device by previously finding out the erroneous mounting before the frame 5 is joined to the primary chip 1. The following items (1) and (2) are examples of a method of examining the appearance:

(1) If the frame 5 is transparent, identification indications including characters and other symbols are formed on rear surfaces of the secondary chips 2a and 2b arranged on the frame 5 (surfaces opposite to the device forming surfaces, i.e., upper surfaces in FIG. 1). The identification indications can be pattern-recognized through the frame 5, thereby making it possible to confirm before assembling whether the secondary chips 2a and 2b are correctly arranged.

(2) If the frame 5 is opaque, identification indications including characters and other symbols are attached to bump mounting surfaces of the secondary chips 2a and 2b (the device formation surfaces, i.e., lower surfaces in FIG. 1). The identification indications can be pattern-recognized from a chip mounting surface of the frame 5, thereby making it possible to confirm before assembling whether the secondary chips 2a and 2b are correctly arranged.

Figure 2:
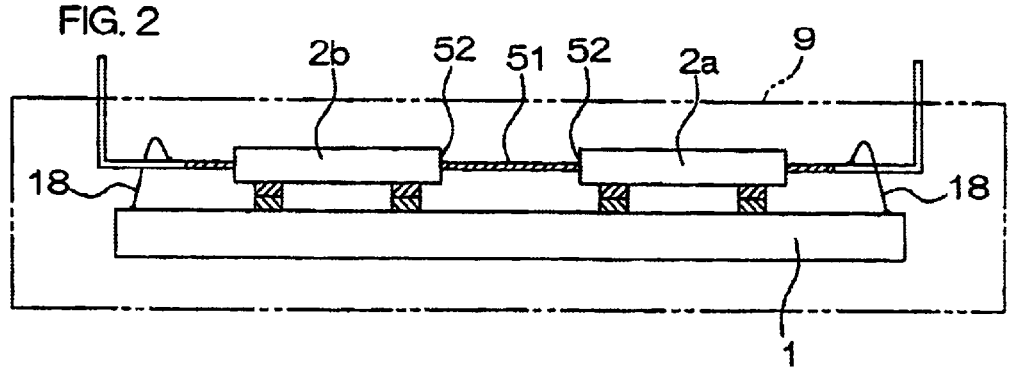
FIG. 2 is a side view showing a state where a plurality of secondary chips are fixed to a frame having holes formed therein, and are overlapped with a primary chip.

FIG. 2 is a diagram showing a modified example of a frame. In the case shown in FIG. 2, a frame 51 having holes formed therein is used, and secondary hips 2a and 2b are respectively fitted in the holes. Stoppers (not shown) are respectively provided in predetermined portions on inner edges of the holes such that the inserted secondary chips 2a and 2b do not slip off. In the frame 51, a plurality of holes corresponding to the secondary chips 2a and 2b are formed in a relative positional relationship corresponding to positions, to which the secondary chips 2a and 2b are to be joined, on the primary chip 1.

According to the present embodiment, rear surfaces of the secondary chips 2a and 2b arranged in the frame 51 can be imaged irrespective of whether the frame 51 is transparent or opaque. If identification indications are formed on wiring of the secondary chips 2a and 2b, it is possible to confirm before assembling whether the secondary chips 2a and 2b are correctly arranged by pattern-recognizing the identification indications.

According to the present embodiment, the holes 25 corresponding to the sizes of the secondary chips 2a and 2b are formed. When the sizes of the secondary chips 2a and 2b differ from each other, the holes themselves are means for preventing the secondary chips 2a and 2b from being erroneously mounted.

The frame 5 or the frame 51 can be also used as a lead frame, for example. In this case, another lead frame need not be used, so that the number of members is saved. When the frame 5 or 51 is also used as a lead frame, an external connecting terminal of the primary chip 1 may be electrically connected to the frame by suitable means such as wire bonding. In FIG. 2, bonding wires 18 are shown which connect the frame 51 to the primary chip 1.

Figure 3A:
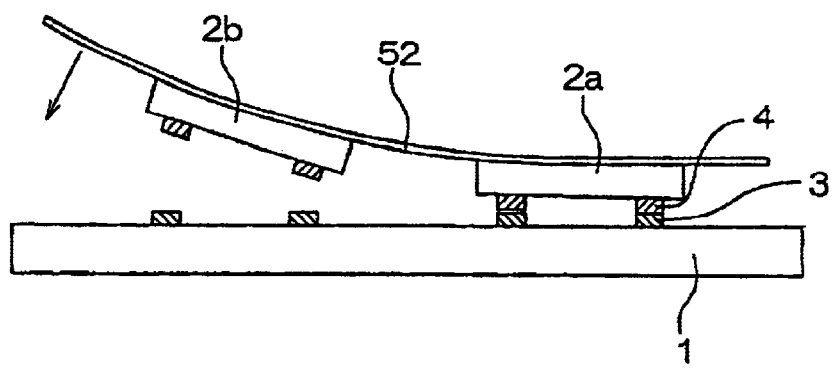
FIGS. 3A and 3B are side views showing another embodiment of the present invention, in which secondary chips are mounted, and a frame is separated from the secondary chips.
Figure 3B:
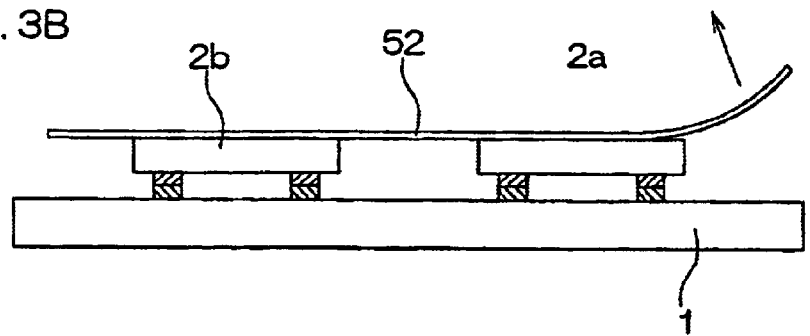

FIGS. 3A and 3B are side views showing another embodiment of the present invention. In the present embodiment, secondary chips 2a and 2b are mounted, and a frame 52 is then separated from the secondary chips 2a and 2b. The frame 52 is preferably made of a flexible material such as a resin film. The secondary chips 2a and 2b are previously mounted on the frame 52 in a relative positional relationship corresponding to positions, to which the secondary chips 2a and 2b are to be joined, on a primary chip 1.

FIG. 3A illustrates the step of joining the secondary chips 2a and 2b mounted on the frame 52 to the primary chip 1.

FIG. 3B illustrates the step of joining bumps 3 and 4 to each other by heating or ultrasonic wave application and then stripping the frame 52 from the secondary chips 2a and 2b. When the frame 52 is stripped, the bumps 3 and 4 have already been firmly joined to each other. Therefore, the joining between the bumps 3 and 4 may not be released from an external force caused by an operation for stripping the frame 52.

The present invention is not limited to the above-mentioned embodiment. Although description has been made of a case where the number of secondary chips is two, for example, the present invention is not limited to the same. For example, the number may be an arbitrary number which is not less than two.

Although the present invention has been described and illustrated in detail, it is clearly understood that the same is by way of illustration and example only and is not to be taken by way of limitation, the spirit and scope of the present invention being limited only by the terms of the appended claims.

This application claims priority benefits under 35 USC §119 of Japanese Patent Application No. 11-45210 filed with the Japanese Patent Office on Feb. 23, 1999, the disclosure of which is incorporated hereinto by reference.

What is claimed is:

1. A semiconductor device comprising:
   a primary chip having a first primary chip surface and including a plurality of electrically-conductive primary chip elements formed on the first primary chip surface, the plurality of primary chip elements arranged in a predetermined pattern; and
   a secondary chip assembly including a frame having a mounting area including plurality of holes formed therethrough and a plurality of secondary chips with each secondary chip having a first secondary chip surface and including a plurality of electrically-conductive secondary chip elements formed on the first secondary chip surface, each one of the secondary chips being received by a respective one of the plurality of holes to mount the secondary chips to the frame, the mounted secondary chips being arranged such that the plurality of secondary chip elements are arranged in a mirrored pattern relative to the predetermined pattern so that respective opposing ones of the plurality of the primary and secondary chip elements register with and join each other in an electrical and mechanical manner.

2. The semiconductor device according to claim 1, wherein the plurality of semiconductor chips and the frame art together sealed with resin.

3. The semiconductor device according to claim 1, wherein the solid is another semiconductor chip.

4. The semiconductor device according to claim 1, wherein the frame is also used as a lead frame.

5. A semiconductor device according to claim 1, further comprising a plurality of bonding wires electrically connecting the primary chip and the frame and
   a resin material encasing the primary chip, the plurality of secondary chips, the mounting area of the frame and the plurality of bonding wires.

6. A semiconductor device according to claim 1, wherein at least one of the plurality of the primary chip elements and the plurality of the secondary chip elements is bumps projecting from a respective one of the first primary chip surface and the first secondary chip surface.

* * * * *